US012673626B2

(12) United States Patent　　　　(10) Patent No.:　US 12,673,626 B2
Koo　　　　　　　　　　　　　　　　(45) Date of Patent:　　　Jul. 7, 2026

(54) METHOD OF DIAGNOSING MALFUNCTION OF OBD CONTROLLER SYSTEM OF HYBRID ELECTRIC VEHICLE

(71) Applicants: HYUNDAI MOTOR COMPANY, Seoul (KR); KIA CORPORATION, Seoul (KR)

(72) Inventor: Bon-Chang Koo, Seongnam-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 239 days.

(21) Appl. No.: 18/101,741

(22) Filed: Jan. 26, 2023

(65) Prior Publication Data

US 2024/0101051 A1　　Mar. 28, 2024

(30) Foreign Application Priority Data

Sep. 26, 2022　(KR) ........................ 10-2022-0121766

(51) Int. Cl.
　　*B60R 16/023*　　　(2006.01)
　　*B60L 58/12*　　　　(2019.01)
　　*G01R 31/3835*　　(2019.01)
　　*G07C 5/08*　　　　(2006.01)
(52) U.S. Cl.
　　CPC ...... *B60R 16/0232* (2013.01); *G01R 31/3835* (2019.01); *G07C 5/0808* (2013.01); *B60L 58/12* (2019.02)
(58) Field of Classification Search
　　CPC ............ B60R 16/0232; G01R 31/3835; G07C 5/0808; B60L 58/12
　　See application file for complete search history.

(56) References Cited

U.S. PATENT DOCUMENTS

| | | | |
|---|---|---|---|
| 2009/0299561 A1* | 12/2009 | Matsumoto .............. | B60K 6/28 903/903 |
| 2012/0019194 A1* | 1/2012 | Krauer .................... | B60L 53/24 320/107 |
| 2013/0106423 A1* | 5/2013 | Moon ................... | B60L 3/0023 324/418 |
| 2016/0282419 A1* | 9/2016 | Eitel .................... | G01R 31/385 |
| 2017/0140583 A1* | 5/2017 | Seibert .................... | G06N 5/04 |
| 2017/0259687 A1* | 9/2017 | Chikkannanavar .......................... H02J 7/00308 |
| 2020/0134944 A1* | 4/2020 | Yumoto ............. | G01R 31/3278 |
| 2023/0098099 A1* | 3/2023 | Kumar ................... | B60R 16/03 701/36 |
| 2024/0217344 A1* | 7/2024 | Ono .......................... | B60L 3/00 |

FOREIGN PATENT DOCUMENTS

| | | | |
|---|---|---|---|
| JP | 4793058 B2 | * | 10/2011 |
| KR | 10-0867834 B1 | | 11/2008 |

* cited by examiner

*Primary Examiner* — Jelani A Smith
*Assistant Examiner* — Hana Lee
(74) *Attorney, Agent, or Firm* — MCDONNELL BOEHNEN HULBERT & BERGHOFF LLP

(57) ABSTRACT

A malfunction of an on-board diagnostic (OBD) controller system is diagnosed by comparing a voltage of an input part of an OBD controller with a voltage of a battery. The OBD controller is connected to the battery through a communication line in a hybrid electric vehicle (HEV). When an input voltage measuring circuit or the controller is malfunctioning, the malfunction is diagnosed.

5 Claims, 6 Drawing Sheets

METHOD OF DIAGNOSING MALFUNCTION OF OBD CONTROLLER SYSTEM OF HYBRID ELECTRIC VEHICLE

CROSS REFERENCE TO RELATED APPLICATIONS

This application claims priority to Korean Patent Application No. 10-2022-0121766, filed on Sep. 26, 2022, which is incorporated herein by reference in its entirety.

BACKGROUND

Field of the Disclosure

The present disclosure relates to a method of diagnosing whether or not an on-board diagnostic (OBD) controller system of a hybrid electric vehicle (HEV) is malfunctioning.

Description of Related Art

A diagnosis using a battery voltage will be banned in North America from 24MY (i.e., the end of 2023). In such a case, a monitoring diagnosis of an abnormality in a battery voltage is required.

All of on-board diagnostic (OBD) controllers of a hybrid electric vehicle (HEV) perform a diagnosis using a voltage from a battery. In the occurrence of a low voltage or a high voltage, such OBD controllers stop the diagnosis since a misdiagnosis may occur.

As illustrated in FIG. 1, in a conventional diagnosis method, a malfunction diagnosis is performed in the occurrence of a low voltage (9 V) or a high voltage (16 V) with respect to a voltage supplied to a system only in an engine control unit (ECU) that turns an engine warning light on.

The ECU performs a malfunction diagnosis on an input voltage with respect to the voltage supplied to the system. However, when an input voltage is abnormally measured using a circuit for measuring an input voltage or by a logic error, diagnoses of most sensors and actuators may be stopped.

The foregoing described in the Background Section is intended merely to aid in the understanding of the background of the present disclosure, and may include features not falling within the purview of the related art that is already known to those skilled in the art.

SUMMARY

Accordingly, an objective of the present disclosure considering the above point is to provide a method of diagnosing an abnormality in system voltage performance in an on-board diagnostic (OBD) controller system of a hybrid electric vehicle (HEV), wherein, when an input voltage measuring circuit or the controller is malfunctioning, the malfunction may be diagnosed.

In one aspect, the present disclosure provides a method of diagnosing a malfunction of an on-board diagnostic (OBD) controller system of a hybrid electric vehicle (HEV). The method may diagnose a malfunction of the OBD controller system by comparing a voltage of an input part of an OBD controller with a voltage of a battery, wherein the OBD controller is connected to the battery through a communication line in the HEV.

The method may further include calculating an average value of the voltage of the input part for a predetermined time, and calculating an average value of the voltage of the battery for a predetermined time. Whether or not the OBD controller system is malfunctioning may be diagnosed by comparing the average value of the voltage of the input part and the average value of the voltage of the battery.

The method may further include determining the OBD controller system to be malfunctioning when a difference between the average value of the voltage of the input part and the average value of the voltage of the battery exceeds a predetermined reference value; and determining the OBD controller system to be normal when the difference between the average value of the voltage of the input part and the average value of the voltage of the battery is equal to or smaller than the predetermined reference value.

The reference value may be set differently according to the state of charge (SOC) of the battery of the HEV.

The method may further include receiving the SOC of the battery before comparing the average value of the voltage of the input part and the average value of the voltage of the battery. The reference value may be set 2 V when the SOC of the battery is 80% or more and 4 V when the SOC of the battery is 30% or less.

The method may further include determining a vehicle speed of the HEV before calculating the average value of the voltage of the input part. When the vehicle speed of the HEV may be equal to or lower than 10 KPH, the diagnosing of the malfunction of the OBD controller system may stopped.

The method may further include determining an operating state of a starter for starting the HEV before the calculation of the average value of the voltage of the input part. When the starter is not operating, the diagnosing of the malfunction of the OBD controller system may be stopped.

The method may further include determining a communication state of a controller area network (CAN). When there is an abnormality in the CAN communication state, the diagnosing of the malfunction of the OBD controller system may be stopped.

The OBD controller may receive the voltage of the battery via CAN communication.

The method of diagnosing the malfunction of an OBD controller system of an HEV according to the present disclosure may perform a malfunction diagnosis of whether or not there is an abnormality in a system voltage used as a malfunction diagnosis entrance condition of the controller.

In addition, it is possible to determine whether or not the input voltage circuit of the controller is malfunctioning by comparing an input voltage with a voltage of the battery sensor received via communication.

Accordingly, it is possible to meet the requirements of the enhanced diagnostic regulations of North America.

DETAILED DESCRIPTION

Figure 1:
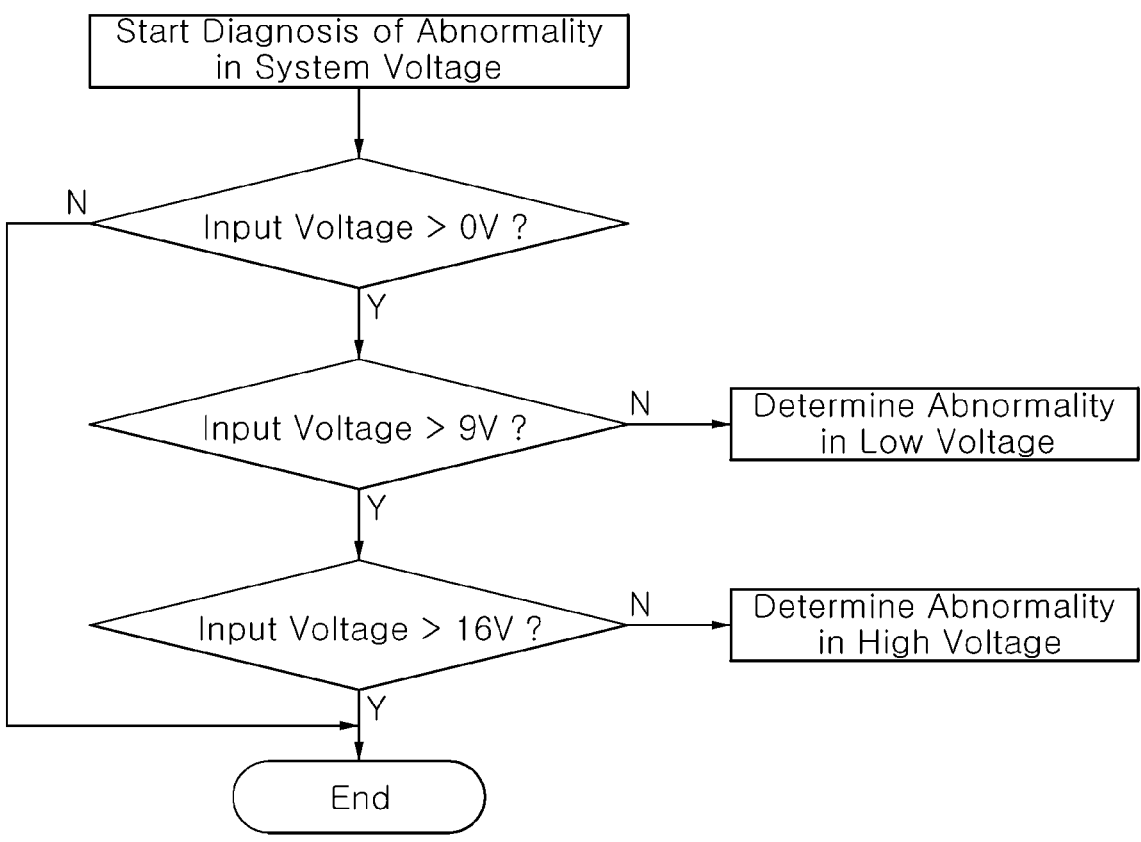
FIG. 1 illustrates a method of diagnosing an OBD controller of the related art.

To fully understand advantages in operation of the present disclosure and objects achieved by embodiments of the present disclosure, it is necessary to refer to the attached drawings illustrating exemplary embodiments of the present disclosure and contents disclosed in the drawings.

In the following description of the present disclosure, a detailed description of related known technology will be omitted in the situation in which the subject matter of the present disclosure may be rendered rather unclear thereby.

Figure 2:
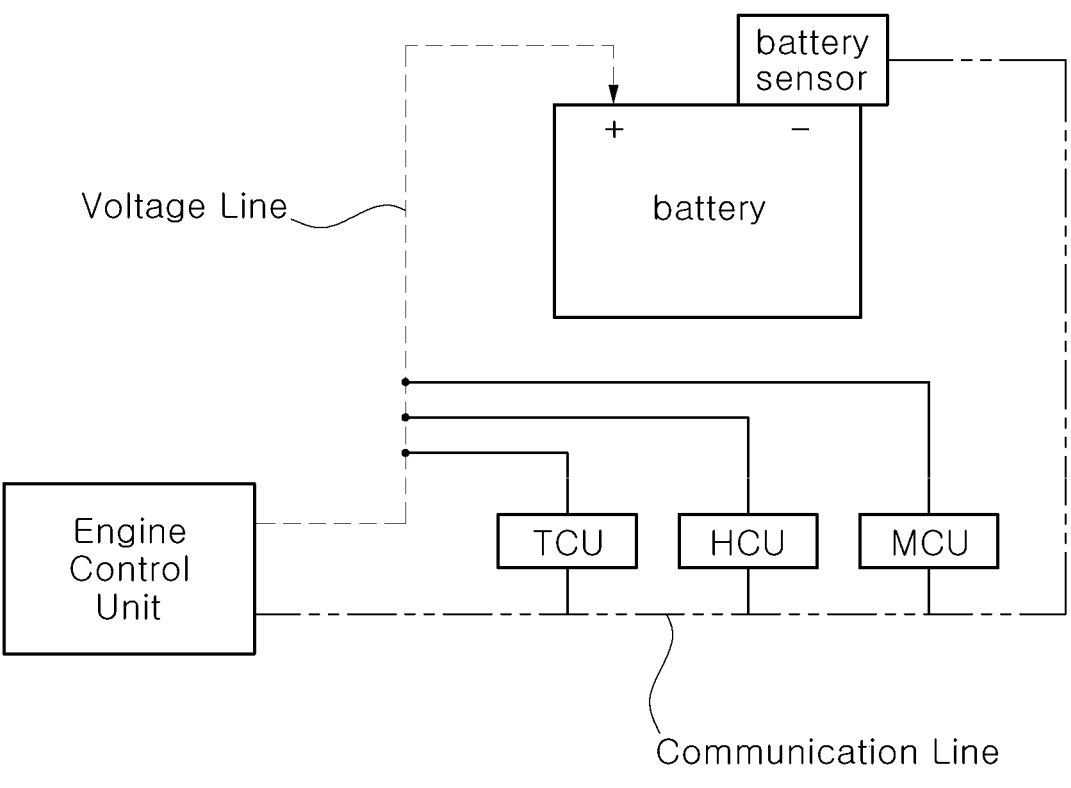
FIG. 2 schematically illustrates a system for diagnosing the malfunction of an OBD controller system according to the present disclosure.
Figure 3:
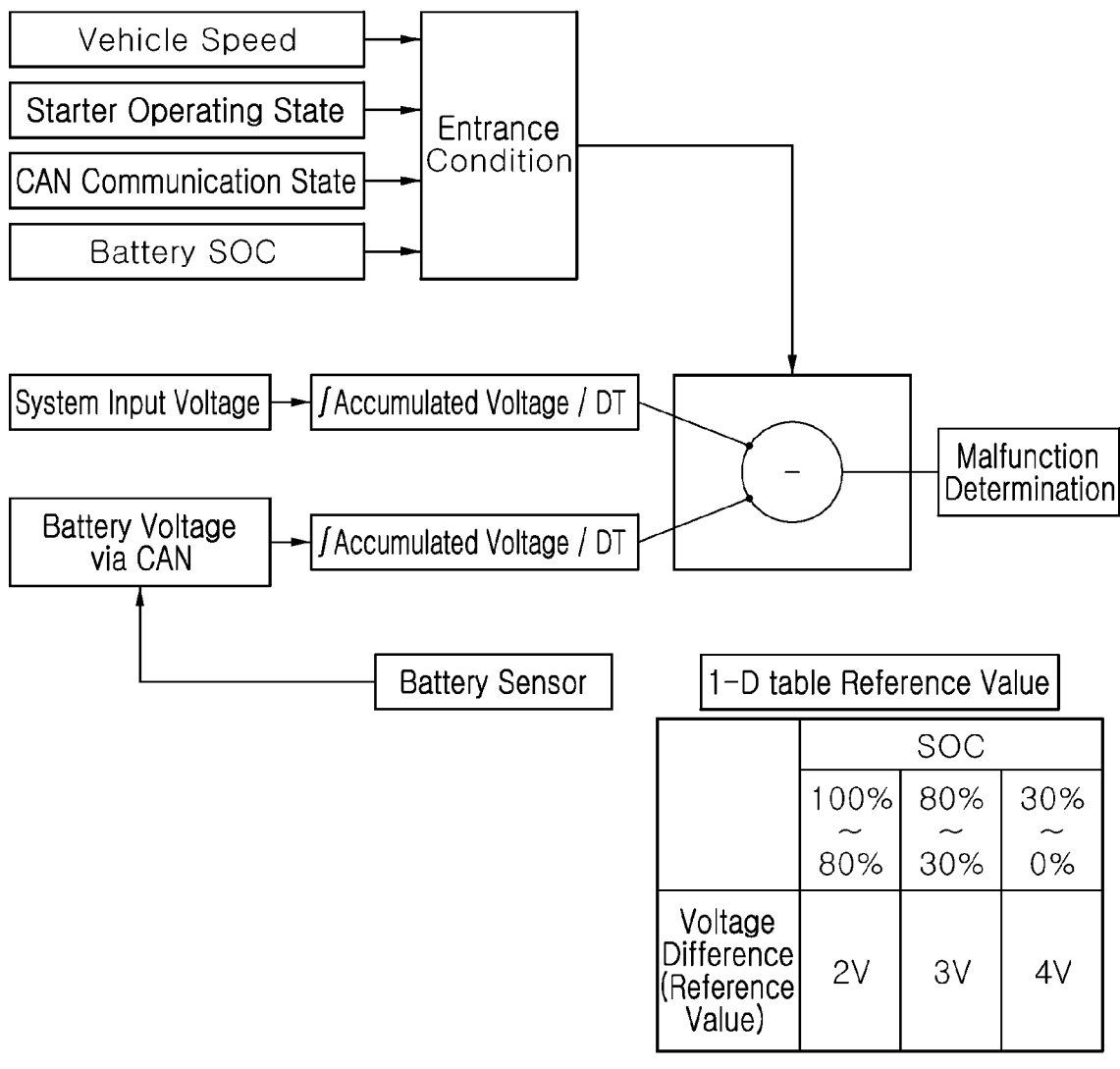
FIG. 3 illustrates a logic of a method of diagnosing the malfunction of an OBD controller system according to the present disclosure.

FIG. 2 schematically illustrates a system for diagnosing the malfunction of an OBD controller system according to the present disclosure, and FIG. 3 illustrates a logic of a method of diagnosing the malfunction of an OBD controller system according to the present disclosure.

Figure 4A:
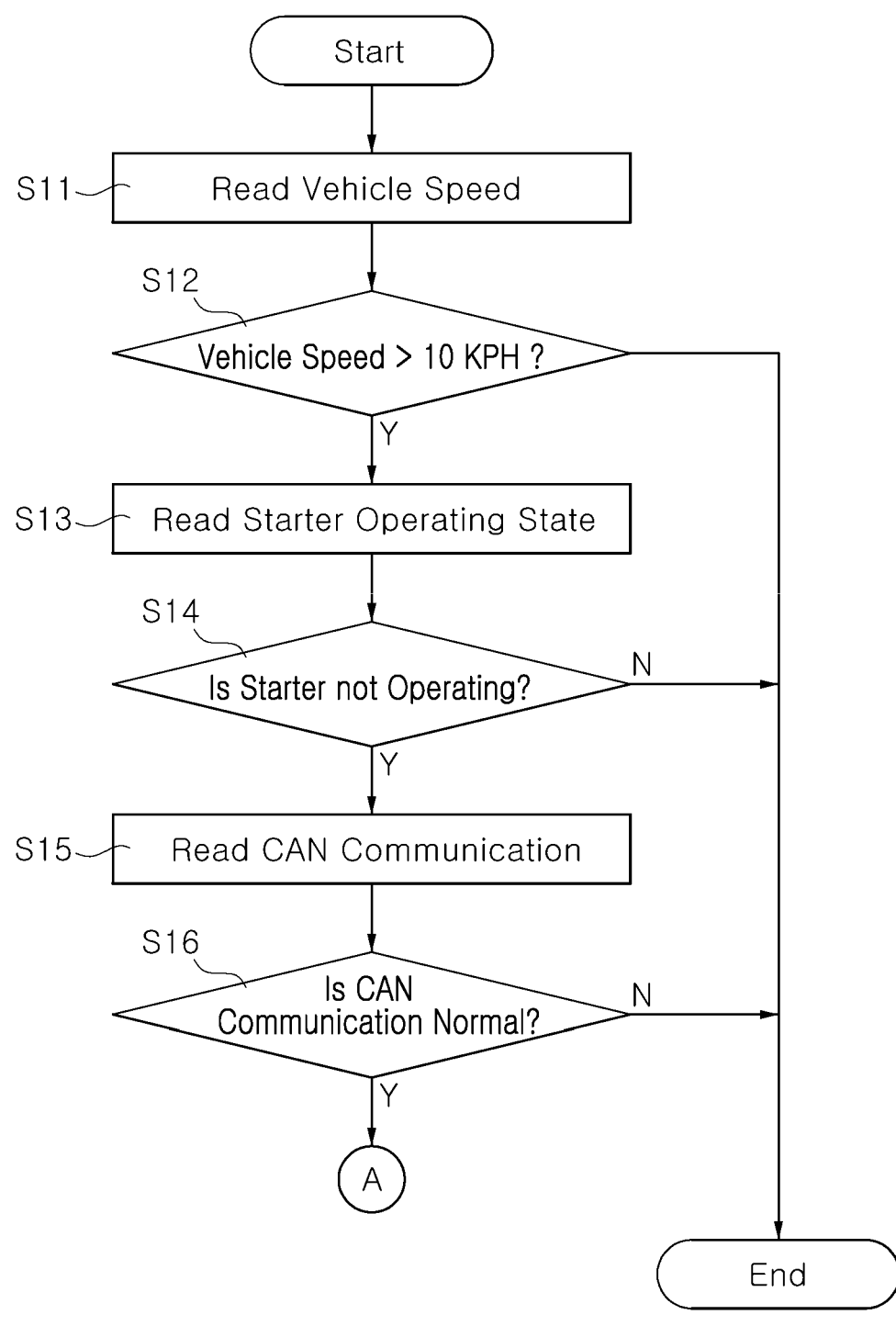
FIGS. 4A and 4B illustrate the method of diagnosing the malfunction of an OBD controller system according to the present disclosure.
Figure 4B:
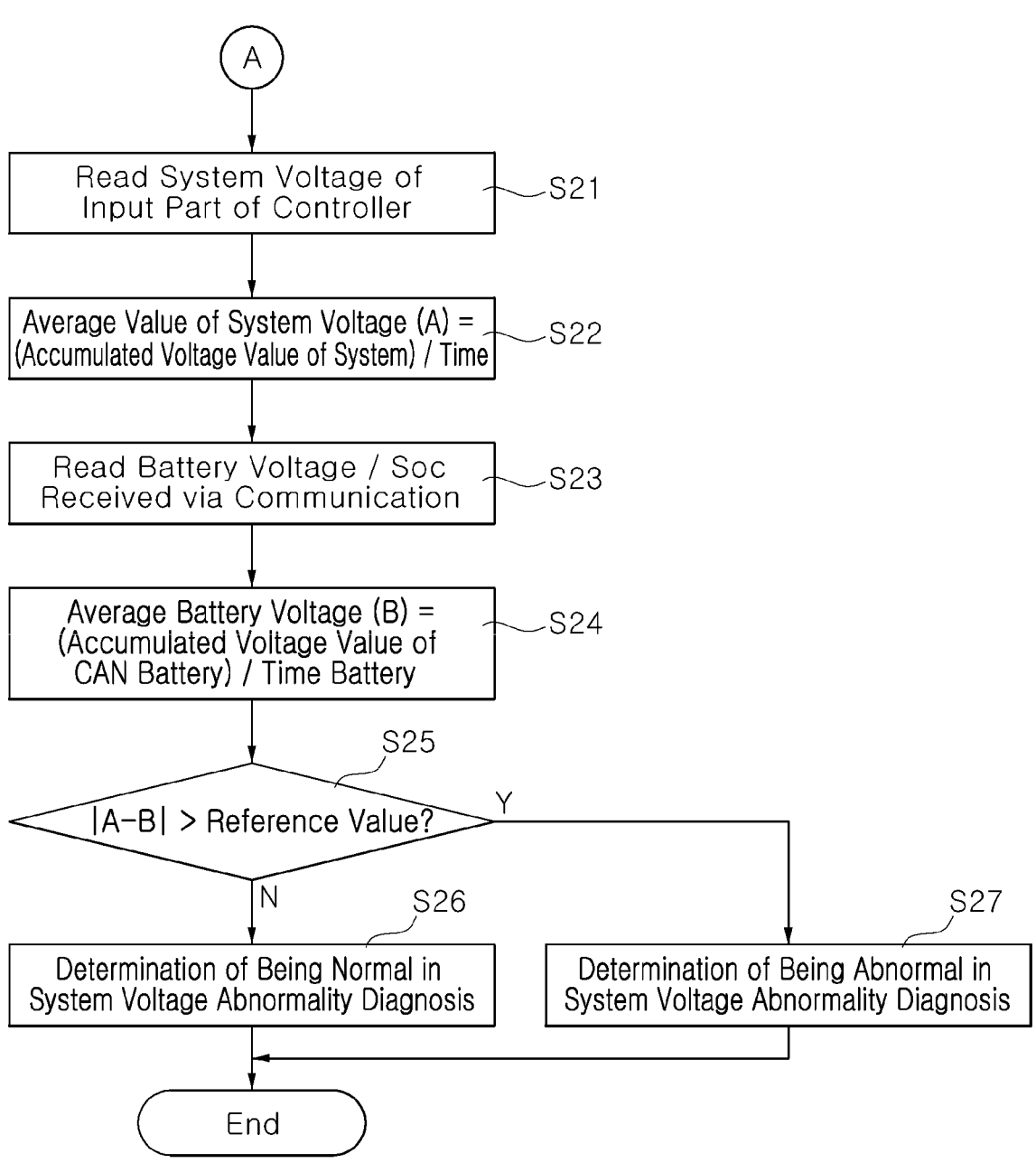

FIGS. 4A and 4B illustrate the method of diagnosing the malfunction of an OBD controller system according to the present disclosure.

Hereinafter, the method of diagnosing the malfunction of an OBD controller system according to the present disclosure will be described with reference to FIGS. 2 to 4B.

Each of an engine control unit (ECU), a transmission control unit (TCU), a hybrid control unit (HCU), a motor control unit (MCU), and a battery management unit (BMU) serving as an OBD controller (i.e., an on-board controller) of a hybrid electric vehicle (HEV) stops a malfunction diagnosis when a system voltage is equal to or lower than 9V on the basis of an input line of the controller itself.

The malfunction diagnosis is stopped when a system voltage is erroneously determined to be a low voltage or a high voltage due to the malfunction of an input circuit of the controller or an error in a single controller.

Thus, in an HEV according to the present disclosure, the OBD controller is connected to a battery through a communication line. This configuration is intended to diagnose an abnormality in input voltage performance by comparing a voltage of an input part received through a pin of the single controller and a battery voltage received from a battery sensor via communication.

That is, with reference to the system illustrated in FIG. 2 and the logic illustrated in FIG. 3, all OBD controllers receive a battery voltage value measured directly by each controller and a voltage value measured using a battery sensor in a predetermined entrance condition through a controller area network (CAN). Each controller is intended to perform a malfunction diagnosis of whether or not a battery measuring circuit is malfunctioning depending on a difference between the two voltage values.

In particular, in the case of the battery voltage measured by the controller, the voltage diagnosis is stopped during starting since the battery voltage may drop during the starting. The diagnosis is performed only in a steady state in which the vehicle speed is equal to or higher than a predetermined value. In this manner, an erroneous diagnosis may be prevented.

The method of diagnosing the malfunction of an OBD controller system according to the present disclosure will be described in more detail with reference to FIG. 3 and FIGS. 4A and 4B.

First, whether or not an entrance condition of the present disclosure is met will be determined.

A vehicle speed is read S11, and whether or not vehicle speed information exceeds a reference value in S12. These steps are intended to perform a diagnosis only in a steady state so that the diagnosis is not performed during starting, in consideration of the possibility that a battery voltage may drop during starting. Control is stopped when the vehicle speed is equal to or lower than 10 KPH.

In addition, when the vehicle speed exceeds 10 KPH, an operating state of a starter is read in S13, and whether or not the starter is operating is determined in S14.

That is, when the starter for starting an HEV is not operating, the control is stopped, and when the starter is operating, a CAN communication state is read in S15.

In addition, whether or not the CAN communication state is normal is determined in S16. When the CAN communication state is abnormal, the control is ended.

When the CAN communication state is normal as a result of the determination, a system voltage of an input part of the OBD controller is read in S21, and a system average voltage value A that is a value of the voltage accumulated for a predetermined time is calculated in S22.

In addition, the battery voltage is received from a battery sensor via CAN communication and the state of charge (SOC) of the battery is read in S23.

In this manner, a battery average voltage value B that is a value of the voltage accumulated for a predetermined time is calculated in S24.

Afterwards, whether or not the difference between the system average voltage value A and the battery average voltage value B calculated as above is greater than a reference value is determined in S25.

When the difference is equal to or smaller than the reference value as a result of the determination, the system voltage of the input part of the OBD controller is determined to be normal in S26. When the difference exceeds the reference value, the system voltage of the input part of the OBD controller is determined to be abnormal in S27.

As described above, the present disclosure determines that the OBD controller system is malfunctioning, i.e., the OBD controller itself is malfunctioning or the input circuit is malfunctioning, when the difference between the system voltage of the input part of the OBD controller and the battery voltage collected from the battery sensor exceeds the predetermined reference value in a predetermined entrance condition.

Here, the reference value with which the difference between the system average voltage value A and the battery average voltage value B is compared varies depending on the SOC read in S23.

That is, with reference to FIG. 3, the reference value is 2 V when the SOC is 80% or more and 4 V when the SOC is 30% or less.

In addition, for the range between 30% and 80%, the reference value may be 3 V. Thus, the reference value may be differently applied according to the SOC, and have a value inverse proportional to the SOC.

Figure 5:
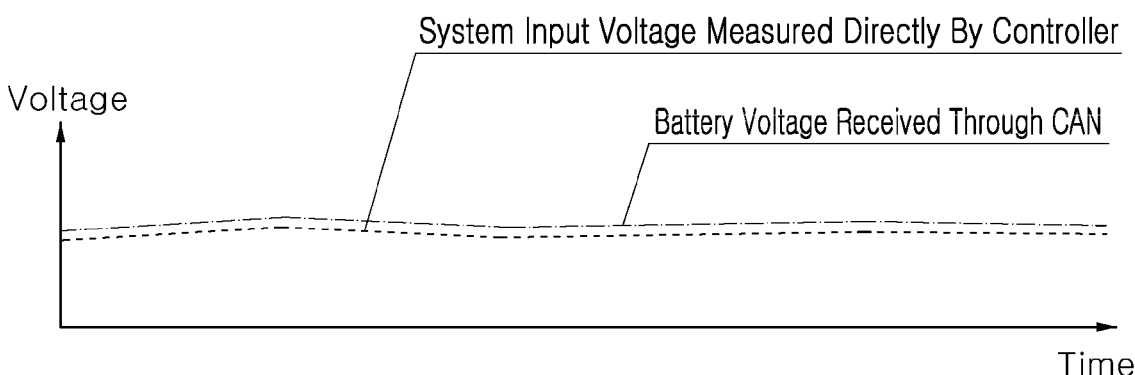
FIG. 5 illustrates a battery reception voltage and a system input voltage in a normal state.
Figure 6:
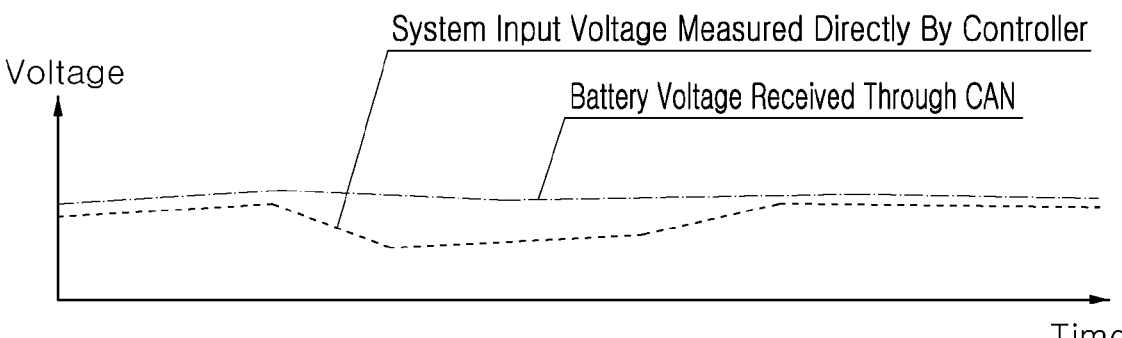
FIG. 6 illustrates a battery reception voltage and a system input voltage in a malfunctioning state.

As can be seen from the normal state of the controller circuit in FIG. 5 and the abnormal state of the controller circuit in FIG. 6, the difference between the system average voltage value A and the battery average voltage value B is 1 V or less in the normal state in FIG. 5 but is 2 V or more in the abnormal state in FIG. 6.

As set forth above, according to the present disclosure, it is possible to diagnose whether or not there is an abnormality in the system voltage used as an entrance reference for diagnosis of the malfunction of the controller. Whether or not an input voltage circuit of the controller is malfunctioning may be determined by comparing the system voltage with an input voltage received from the battery sensor via communication.

Although the present disclosure as set forth above has been described with reference to the accompanying drawings, the present disclosure is not limited to the foregoing embodiments. It will be apparent to those skilled in the art that a variety of modifications and variations are possible without departing from the spirit and scope of the present disclosure. Therefore, such modifications or variations shall be within the claims of the present disclosure, and the scope of right of the present disclosure shall be interpreted on the basis of the appended claims.

The invention claimed is:

1. A method of diagnosing a malfunction of an on-board diagnostic (OBD) controller system of a hybrid electric vehicle (HEV), the method comprising:

providing a battery connected to an OBD controller through a communication line in the HEV;

outputting, by the OBD controller, an average value of a system voltage of an input part for a predetermined time; and outputting an average value of a voltage of the battery for the predetermined time;

outputting, by the OBD controller, a malfunction signal of the OBD controller system when a difference between the average value of the system voltage of the input part and the average value of the voltage of the battery exceeds a predetermined reference value; and outputting, by the OBD controller, a normal signal of the OBD controller system when the difference between the average value of the system voltage of the input part and the average value of the voltage of the battery is equal to or smaller than the predetermined reference value; and wherein the predetermined reference value is set according to a state of charge (SOC) of the battery of the HEV;

further comprising receiving, by the OBD controller, the SOC of the battery before outputting the malfunction signal of the OBD controller;

wherein the predetermined reference value is set to 2 V when the SOC of the battery is 80% or more and 4 V when the SOC of the battery is 30% or less.

2. The method of claim 1, further comprising receiving, by the OBD controller, a vehicle speed of the HEV before calculating the average value of the system voltage of the input part, outputting, by the OBD controller, the normal signal of the OBD controller system when the vehicle speed of the HEV is equal to or lower than 10 KPH.

3. The method of claim 1, further comprising receiving, by the OBD controller, an operating state of a starter for starting the HEV before the calculation of the average value of the system voltage of the input part, outputting, by the OBD controller, the normal signal of the OBD controller system, when the starter is not operating.

4. The method of claim 1, further comprising receiving, by the OBD controller, a communication state of a controller area network (CAN), outputting, by the OBD controller, the normal signal of the OBD controller system, when there is an abnormality in the CAN communication state.

5. The method of claim 4, wherein the OBD controller receives the voltage of the battery via CAN communication.

* * * * *